(12) United States Patent
Lau et al.

(10) Patent No.: US 6,760,452 B2
(45) Date of Patent: Jul. 6, 2004

(54) MULTI-CHANNEL AUDIO SIGNAL LIMITER WITH SHARED CLIP DETECTION

(75) Inventors: Kai Kwang Lau, Livonia, MI (US); Robert Kelly Cadena, Dearborn, MI (US); John Elliott Whitecar, Plymouth, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 118 days.

(21) Appl. No.: 10/279,355

(22) Filed: Oct. 24, 2002

(65) Prior Publication Data

US 2004/0081324 A1 Apr. 29, 2004

(51) Int. Cl.[7] .............................................. H03G 7/00
(52) U.S. Cl. ......................... 381/106; 333/14; 381/107
(58) Field of Search ................................ 381/104, 106, 381/107, 108, 109, 94.1, 94.7, 94.8; 333/14, 28 T; 455/72

(56) References Cited

U.S. PATENT DOCUMENTS

| 4,794,343 A | 12/1988 | Yang ............................... 330/2 |
| 4,912,424 A | 3/1990 | Nicola et al. ................ 330/141 |
| 4,978,926 A | 12/1990 | Zerod et al. ................. 330/279 |
| 5,001,440 A | 3/1991 | Zerod ........................... 331/279 |
| 5,255,324 A | 10/1993 | Brewer et al. ............... 381/107 |
| 5,469,510 A | 11/1995 | Blind et al. .................. 381/551 |
| 5,581,480 A | 12/1996 | Olson et al. ............. 364/514 R |
| 5,783,969 A | 7/1998 | Luz .......................... 330/124 R |
| 5,815,584 A | 9/1998 | Whitecar et al. .............. 381/86 |
| 5,990,750 A | 11/1999 | Katz ........................... 330/295 |
| 6,061,455 A | 5/2000 | Dhadley et al. ............... 381/57 |
| 6,201,873 B1 | 3/2001 | Dal Farra .................... 381/100 |
| 2002/0090096 A1 | 7/2002 | Blind et al. .................. 381/104 |

FOREIGN PATENT DOCUMENTS

GB 2387282 8/2003

Primary Examiner—Xu Mei
(74) Attorney, Agent, or Firm—MacMillan, Sobanski & Todd LLC

(57) ABSTRACT

An audio system limits gain in individual audio channels having a shared clip detect signal from a multi-channel power amplifier such that only channels likely to be exceeding the distortion threshold are gain limited. In addition, any arbitrary channels may be grouped together for common gain limiting. The invention monitors the power level of each audio channel, compares the power level to a power threshold that indicates whether a high power condition with the potential to cause excess distortion exists or not, and makes a decision whether to activate each channel's gain limiter based on whether the corresponding clip detect signal is active and the high power condition exists simultaneously for that channel.

20 Claims, 3 Drawing Sheets

MULTI-CHANNEL AUDIO SIGNAL LIMITER WITH SHARED CLIP DETECTION

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to audio systems which prevent distortion from amplifier clipping by employing dynamic gain limiting, and, more specifically, to a multi-channel audio system wherein separate channels are individually gain limited in response to a shared clip detection signal from a power amplifier.

Typical audio reproduction systems include a variable-gain amplification stage followed by a fixed-gain power amplifier which feeds an output transducer such as a speaker. A volume or gain command (e.g., a control voltage) provided to the variable gain stage (i.e., pre-amplifier) controls the output volume heard by a listener. In one type of known audio system, a digital signal processor (DSP) is used to process the audio signals, including the variable-gain pre-amplification. The digitally processed audio signals are converted to analog signals and applied to a multi-channel analog power amplifier for driving the speakers.

An important objective in designing an audio system is to provide minimum distortion in signal reproduction. However, there is always some distortion, especially at high sound levels. As the magnitude of the signal provided from the variable gain amplifier stage to the power amplifier increases above a certain level, the power amplifier becomes overdriven. This situation occurs when the input signal to the power amplifier multiplied by the fixed gain of the power amplifier approaches the supply voltage level provided to the power amplifier. As a result, the power amplifier becomes saturated and signal peaks of the audio signal are distorted by clipping.

The problem of power amplifier clipping is aggravated in automotive audio systems. Less voltage headroom (i.e., safety margin) is available to the power amplifier since the automobile is limited to a 12-volt electrical supply. Although a DC/DC converter can be used to obtain a higher DC voltage, such converters are relatively expensive. Also, bass boost is needed in the automotive environment to overcome low frequency road and engine noise, making clipping more likely in the bass range of the audio signal.

It is known to employ voltage limiting or compression to the input of a power amplifier to limit the occurrence of clipping (but some amount of clipping up to the limit is desirable; otherwise it may seem that the audio system does not play loud enough). In prior art voltage limiters, the pre-amplifier gain is reduced when the power amplifier exhibits a specific percentage of total harmonic distortion (THD) as measured by the proportion of time over many audio cycles that the amplifier is overdriven. A distortion detector in the power amplifier generates a clip detect signal that is fed back to the pre-amplifier to control the gain reduction. When the clip detect signal is asserted or active, the system enters an attack mode wherein the gain is progressively reduced (from the user-controlled volume setting) at a relatively fast rate for as long as the active clip detect signal is present (but usually only up to a maximum gain cut). When the clip detect signal is no longer asserted (i.e., inactive), the system enters a decay mode wherein the gain is progressively increased at a relatively slower rate until the user-controlled volume is restored (unless the clip detect signal again becomes active).

A typical power amplifier contains multiple audio channels, such as stereo left and right. In automotive audio systems, four channel power amplifiers are common for separately driving left and right speakers in both the front and rear of a vehicle. A fifth channel may be added for a bass channel or a separate power amplifier may also be used.

In the typical power amplifier configuration, distortion above the THD threshold is detected in each channel but only one clip detect signal is generated by OR'ing together the distortion detection of all the channels. This is done in order to reduce the number of output pins of the integrated circuit on which the typical amplifier is constructed and because audio system designers typically choose to treat all channels equally when applying gain cuts. Thus, in response to the clip detect signal, pre-amplifier gain is reduced in all the channels even though not all channels may have exceeded the distortion threshold. For example, the fader controls in an automotive audio system may be set to provide greater amplification to the rear speakers than to the front. When excessive distortion commences in the rear power amplifier channels, both the front and rear channels gains are cut. In an audio system where all channels are playing the same audio source material for listening from all areas of a vehicle, then a consistent gain cut to all channels is desirable.

Automotive audio systems have recently been introduced having dedicated "rear seat entertainment" features wherein listeners in the front of the vehicle may select different audio source material at a different volume setting than listeners in the back of the vehicle (referred to as "dual play"). It is desirable to continue to use the same quad channel power amplifier IC in a dual play audio system, but the practice of prior art systems to limit all channels equally and simultaneously causes undesirable consequences for the audio channels that have not exceeded the distortion threshold. Providing for separate clip detect signals for each channel, however, undesirably increases the output pins of the power amplifier raising the cost of the audio system.

Eight channel audio systems are also popular wherein two quad amplifiers are used to drive a variety of tweeters, mid-range speakers, and woofers. The actual configuration of speakers may differ between different vehicle models (e.g., different numbers of tweeters), although it is desirable to use the same (unmodified) power amplifier IC's in the amplifier module. Because it may be desired to gain limit different types of speakers differently (e.g., limiting the high frequency content of the tweeters differently than the low frequency content of the woofers), the two available clip detect signals have so far not been able achieve optimal gain limiting.

SUMMARY OF THE INVENTION

The present invention has the advantage of limiting individual audio channels having a shared clip detect signal from a multi-channel power amplifier such that only channels likely to be exceeding the distortion threshold are gain limited. In addition, any arbitrary channels may be grouped together for common gain limiting. The invention monitors the power level of each audio channel, compares the power level to a power threshold that indicates whether a high power condition with the potential to cause excess distortion exists or not, and makes a decision whether to activate each channel's gain limiter based on whether the corresponding clip detect signal is active and the high power condition exists simultaneously for that channel.

In one aspect of the invention, an audio system has at least first and second audio channels. First and second gain multipliers receive first and second pre-limiter audio signals and generate first and second post-limiter audio signals in response to first and second scalar gain commands, respectively. A multi-channel power amplifier is responsive to the first and second post-limiter audio signals for generating first and second amplified audio signals. The multi-channel power amplifier includes a distortion detector generating a clip detect signal which is active if either the first or second amplified audio signal exhibits clipping distortion above a distortion threshold. First and second gain command blocks are coupled to the first and second gain multipliers, respectively, for generating the first and second scalar gain commands in response to respective reference values and respective first and second limit command signals. The first and second gain command blocks each enter an attack mode when a respective first or second limit command signal is active and enter a decay mode when a respective first or second limit command signal is not active. The attack mode is comprised of progressively reducing the respective scalar gain command below the respective reference value. The decay mode is comprised of progressively increasing the respective scalar gain command up to the respective reference value. First and second limit command blocks detect first and second audio power of the first and second audio signals, compare each of the first and second detected audio powers to first and second power thresholds, respectively, and activate the first or second limit command signal if the clip detect signal is active and if the respective audio power is above the respective power threshold.

DETAILED DESCRIPTION OF PREFERRED EMBODIMENTS

Figure 1:
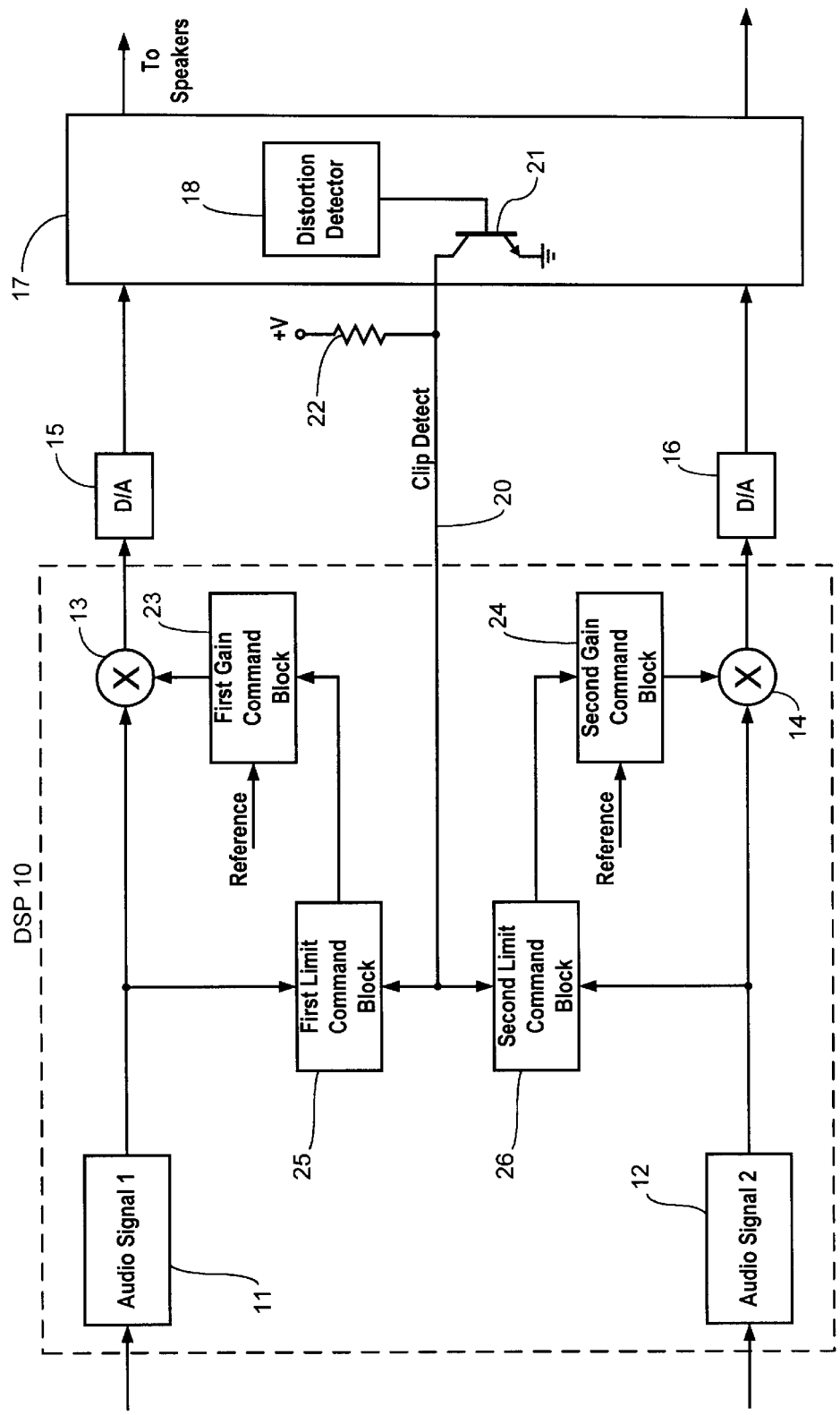
FIG. 1 is a schematic, block diagram showing a preferred embodiment of an audio system of the present invention.

Referring to FIG. 1, an example of the present invention with two audio channels is shown which may be scaled to any number of channels in a straightforward manner. A DSP 10 receives audio signals 1 and 2 from a stereo audio source (not shown) such as a radio tuner, cassette tape player, CD player, or DVD player, for example. DSP 10 includes stereo audio processing blocks 11 and 12 for performing various well known processing functions such as demodulation, volume control, tone control, equalization, filtering, and others to generate first and second pre-limiter audio signals that are coupled to first and second gain multipliers 13 and 14, respectively. The pre-limiter audio signals are multiplied by scalar gain commands which are determined as described below. Multipliers 13 and 14 produce post-limiter audio signals that are converted to analog signals by digital-to-analog converters 15 and 16, respectively. The two-channel analog signals are amplified in respective amplifier sections of a power amplifier 17 and sent to loudspeakers (not shown).

Power amplifier 17 includes a distortion detector 18 for monitoring the duty cycle of clipping in each amplifier channel and for activating its output when the occurrence of clipping in any channel is sufficient to cause distortion is excess of a threshold. Power amplifier 17 may be comprised of a TDA7563 power amplifier available from ST Microelectronics, N.V., for example. When distortion detector 18 determines that the clip detect signal should be activated, it turns on a transistor switch 21. The clip detect signal is output on a line 20 that is connected to the collector of transistor 21 and to a pull-up resistor 22. Thus, when no excessive distortion is detected, transistor 21 is off and a voltage on line 20 is driven to a high level by resistor 22. When excessive distortion is present, then transistor 21 is turned on. Current flows through resistor 22 and to ground through transistor 21 so that the voltage on line 20 drops to a very low level. Thus, in the present embodiment, the clip detect signal has a low logic level when it is active.

The scalar gain commands provided to gain multipliers 13 and 14 are determined by first and second gain command blocks 23 and 24, respectively. Each gain command block receives a respective reference value. In one preferred embodiment, a volume command that has been set by the user may have already been handled in audio processing block 11 and 12. In that case, the reference values are set to one (i.e., when limiting is not active and any prior limiting has fully decayed, then the pre-limiter audio signals are multiplied by a scalar gain of 1 and are, therefore, equal to the post-limiter signals). When in attack mode or while still decaying, the scalar gain commands are less than one, so that the post-limiter signals are reduced compared to the pre-limiter audio signals.

In another embodiment, a user volume setting can be simultaneously implemented using the same multiplier. In that embodiment, the reference values are comprised of the audio volume command(s) set by the user (which may be the same for both channels or may be different depending on the particular audio system application).

Gain blocks 23 and 24 provide respective attack and decay modes for limiting in a manner well known in the art.

In a typical prior art system, the clip detect signal would be coupled directly to gain command blocks 23 and 24. In the present invention, the initiation of limiting in each channel instead depends on a first limit command block 25 and a second limit command block 26, respectively, which provide limit command signals to the gain command blocks. Limit command block 25 receives the first pre-limiter audio signal and the clip detect signal. Limit command block 26 receives the second pre-limiter audio signal and the clip detect signal. Alternatively, limit command blocks 25 and 26 could be adapted to operate using the post-limiter audio signals. Whenever the clip detect signal is not active, the limit command signals provided by the limit command blocks to each gain command block are inactive, thereby putting each gain command block into its decay mode. Whenever the clip detect signal is active, each limit command block detects an audio power of its respective audio signal to determine whether that channel is likely to be one causing the occurrence of clipping and, if so, then passing an active limit command signal to its respective gain command block to put it in its attack mode.

Figure 2:
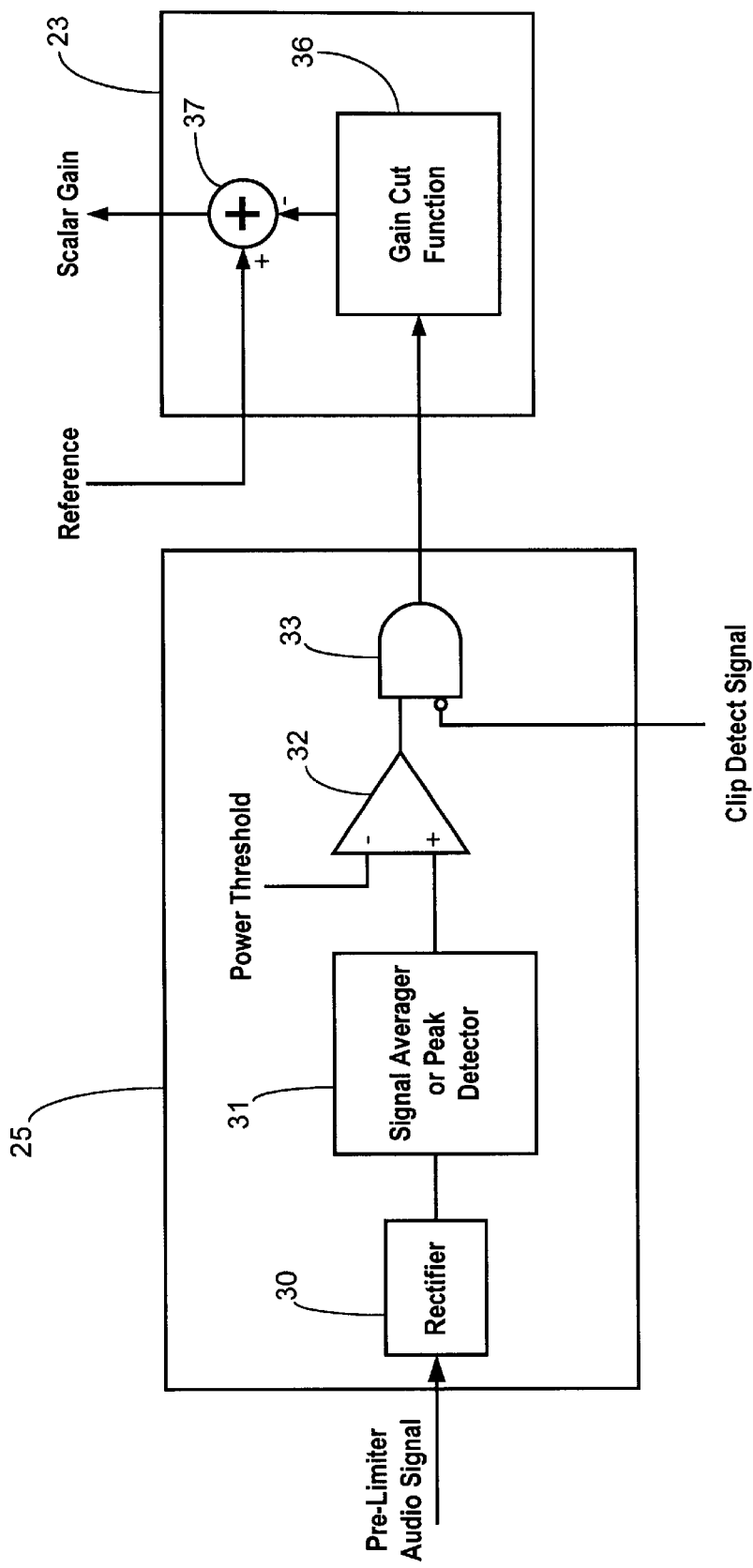
FIG. 2 is a schematic, block diagram showing a limit command block and a gain command block in greater detail.

As shown in FIG. 2, limit command block 25 includes a rectifier 30 for full wave rectifying the pre-limiter audio signal and providing the rectified signal to a power measuring block 31. Power is preferably measured according to a brief time interval as determined by a sliding window of digital samples of the pre-limiter audio signal. Block 31 may be a signal averager wherein the rectified samples in the sliding window are summed and divided by the number of samples in the sliding window. Alternatively, power can be estimated using less computational resources by detecting the peak sample value within the sliding window. The power value from power detector 31 is compared with a corresponding power threshold by a comparison block 32 which outputs a high logic level whenever the measured (or estimated) power exceeds the power threshold. The power threshold may have different values for different audio channels depending upon the type of audio path, for example. The output of comparison block 32 is combined with an inverted clip detect signal in an AND-gate 33 to generate the limit command signal to activate a gain cut function 36 in gain control block 23.

The amount of gain cut generated by function 36 depends upon the duration that the clip signal is active. The gain cut increases from zero at a first rate (i.e., the attack rate) while the clip signal stays active. If the clip detect signal is active for an extraordinarily long time, the gain cut may reach a predetermined maximum gain cut and increase no farther. When the clip signal deactivates, the gain cut decreases toward zero at a second rate (i.e., the decay rate) which is a slower rate than the attack rate. The generated gain cut is applied to a subtracting input of a summer 37. A respective reference value (e.g., either a value of one or an audio volume command as determined in response to a volume knob setting made by the listener) is applied to an adding input of summer 37, and the resulting sum is provided as the scalar gain command to the respective gain multiplier.

Figure 3:
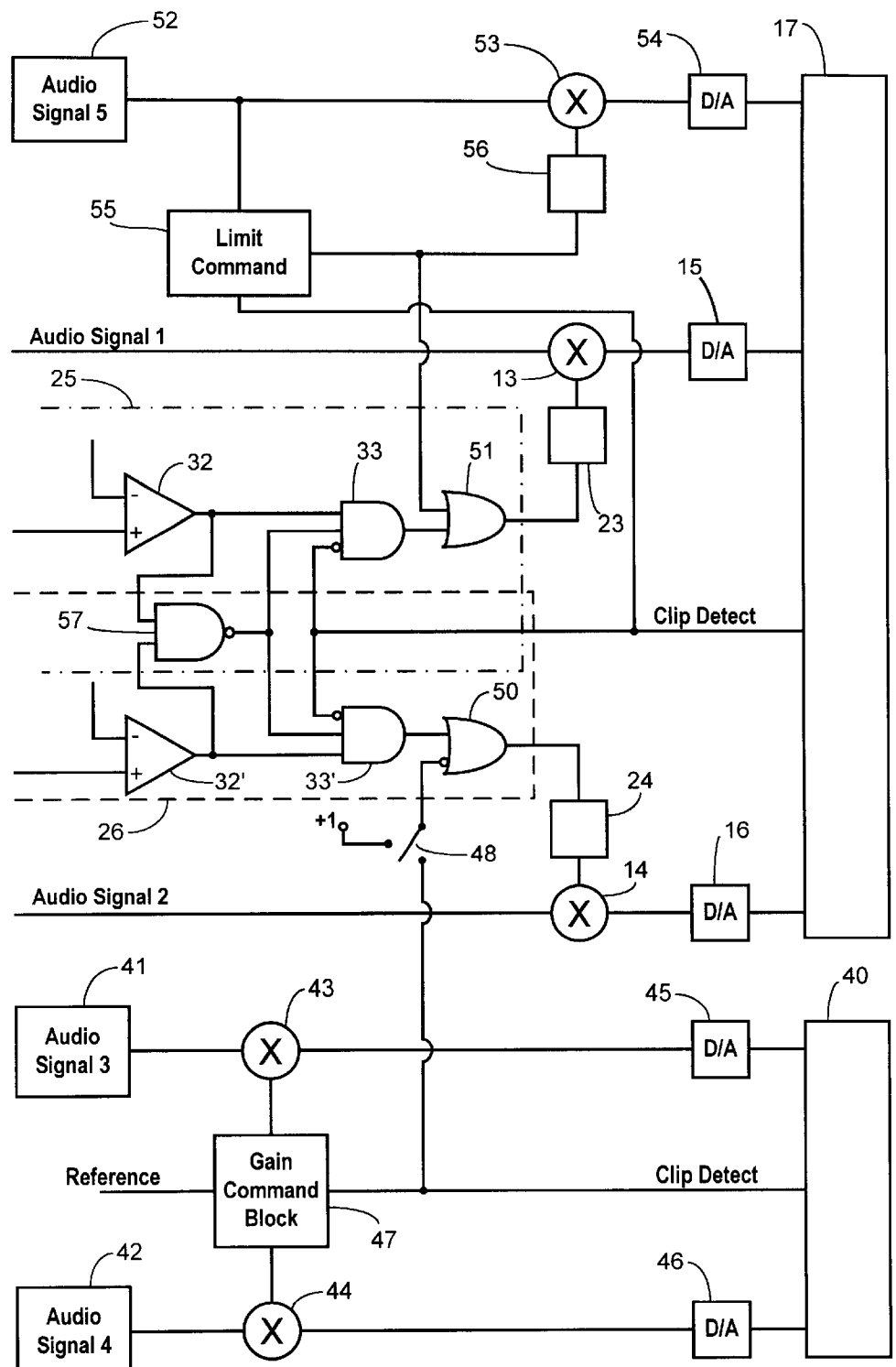
FIG. 3 is a schematic, block diagram showing a further embodiment of the invention.

FIG. 3 shows additional types of interaction of the limiting of various audio channels. A second power amplifier 40 is shown for two additional audio channels wherein an audio signal 3 and an audio signal 4 are processed by DSP blocks 41 and 42, respectively. Gain multipliers 43 and 44 provide post-limiter audio signals to D/A converters 45 and 46, respectively. A clip detect signal for power amplifier 40 is fed back to a gain command block 47 for generating scalar gain commands provided to gain multipliers 43 and 44. In the embodiment shown, audio signals 3 and 4 are limited together. Audio signals 2, 3, and 4 may for example be audio signals going to mid-range speakers while other audio signals drive tweeters and or woofers. In this example, it is desired to activate the limiters for the mid-range speakers together even though they are not all on the same power amplifier and are not all on the same clip detect line. Therefore, the clip detect signal from amplifier 40 may be coupled through a switch 48 to an inverting input of an OR-gate 50. The other input of OR-gate 50 receives the output of an AND-gate 33', and the output of OR-gate 50 provides the limit command signal to gain command block 24. Thus, whenever audio signals 3 and 4 go into attack mode, audio signal 2 is also forced into attack mode.

Switch 48 makes this function selectable. By providing a matrix of such connections within the DSP, concurrent limiting actions can be programmed for any combination of audio channels. When switch 48 is not connected to a clip detect line, it is connected to a high logic level (i.e., an inactive clip detect level). In order for all three channels to always go into attack mode together, a similar OR-gate would be connected between gain command block 47 and the clip detect signal of amplifier 40, with the second input of the OR-gate receiving the output of AND-gate 33', for example.

The limiting of audio signals 3 and 4 are shown as being always functioning together, so that the clip detect signal can be used directly to control the gain block (i.e., the power level detection of the present invention is not used for those channels). Also, the controlling audio channels are on a different power amplifier. In a further embodiment, an audio signal in a channel of the same power amplifier which also uses the power detection method can used to control another channel. Thus, an audio signal 5 is processed by a DSP block 52 for gain limiting by a gain multiplier 53 which provides a post-limiter audio signal to an D/A converter 54. The clip detect signal for power amplifier 17 is coupled to a limit command block 55 which provides a limit command signal to a gain command block 56. The limit command signal is also provided to an OR-gate 51 in limit command block 25 for audio signal 1, resulting in the limiting in the first audio channel whenever the fifth audio channel is in its attack mode.

In a further embodiment of the invention, a NAND-gate 57 has its inputs coupled to the outputs of power comparison blocks 32 and 32' and its output connected to third inputs of AND-gates 33 and 33'. In this embodiment, when both channels are in a high power condition then both limiters are disabled (i.e., put into decay mode), which may be desirable in some applications. NAND-gate 57 may be coupled the other logic elements by coupling switches in order to also make this feature programmable with the DSP.

What is claimed is:

1. An audio system having at least first and second audio channels comprising:

first and second gain multipliers receiving first and second pre-limiter audio signals and generating first and second post-limiter audio signals in response to first and second scalar gain commands, respectively;

a multi-channel power amplifier responsive to said first and second post-limiter audio signals for generating first and second amplified audio signals, wherein said multi-channel power amplifier includes a distortion detector generating a clip detect signal which is active if either said first or second amplified audio signal exhibits clipping distortion above a distortion threshold;

first and second gain command blocks coupled to said first and second gain multipliers, respectively, for generating said first and second scalar gain commands in response to respective reference values and respective first and second limit command signals, said first and second gain command blocks each entering an attack mode when a respective first or second limit command signal is active and entering a decay mode when a respective first or second limit command signal is not active, wherein said attack mode is comprised of progressively reducing said respective scalar gain command below said respective reference value, and wherein said decay mode is comprised of progressively increasing said respective scalar gain command up to said respective reference value; and first and second limit command blocks for detecting first and second audio power at predetermined points in said first and second audio channels, comparing each of said first and second detected audio powers to first and second power thresholds, respectively, and activating said first or second limit command signal if said clip detect signal is active and if said respective audio power is above said respective power threshold.

2. The audio system of claim 1 wherein each of said limit command blocks comprises:

a rectifier for rectifying a respective audio signal;

a power measurement block receiving a rectified signal from said rectifier and generating a measured power signal;

a comparator for comparing said measured power signal with a respective power threshold; and an AND gate for generating a respective limit command signal in response to said comparator and said clip detect signal.

3. The audio system of claim 2 wherein said power measurement block is comprised of an averager calculating an average value of said pre-limiter audio signal in response to a sliding window.

4. The audio system of claim 2 wherein said power measurement block is comprised of a peak detector.

5. The audio system of claim 1 wherein one of said limit command blocks corresponding to a particular audio channel is responsive to limiting of a different audio channel of said audio system such that said limit command signal of said one limit command block is active if a limiting signal of said different audio channel is active.

6. The audio system of claim 5 wherein said one of said limit command blocks comprises:

a rectifier for rectifying a respective audio signal;

a power measurement block receiving a rectified signal from said rectifier and generating a measured power signal;

a comparator for comparing said measured power signal with a respective power threshold;

an AND gate for generating an output signal in response to said comparator and said clip detect signal; and an OR gate for generating said limit command signal of said one limit command block in response said output signal and said limiting signal from said different audio channel.

7. The audio system of claim 5 wherein said limiting signal from said different audio channel is comprised of a corresponding limit command signal.

8. The audio system of claim 5 wherein said different audio channel is amplified by a different power amplifier and wherein said limiting signal from said different audio channel is comprised of a corresponding limit command signal.

9. The audio system of claim 5 wherein said different audio channel is amplified by a different power amplifier and wherein said limiting signal from said different audio channel is comprised of a corresponding clip detect signal.

10. The audio system of claim 1 comprising a digital signal processor for implementing said gain multipliers, said gain command blocks, and said limit command blocks, and wherein said audio system further comprises first and second digital-to-analog converters coupled between said first and second gain multipliers and said multi-channel power amplifier, respectively.

11. The audio system of claim 1 wherein said respective reference values are each substantially equal to one.

12. The audio system of claim 1 wherein said respective reference values are comprised of volume command signals.

13. A method of limiting clipping distortion in a multi-channel audio system having at least first and second audio channels for processing first and second audio signals, said audio system including a multi-channel power amplifier having a distortion detector monitoring a plurality of channels of said amplifier, said method comprising the steps of:

generating first and second pre-limiter audio signals from an audio source;

multiplying said first and second pre-limiter audio signals by first and second scalar gain commands, respectively, to produce first and second post-limiter audio signals, wherein said first and second scalar gain commands include first and second reference values, respectively;

amplifying said first and second post-limiter audio signals in said multi-channel power amplifier;

generating a clip detect signal at an active level if said distortion detector detects distortion above a distortion threshold in any channel of said amplifier;

measuring first and second audio power values responsive to said first and second audio signals, respectively;

comparing said first and second audio power values with first and second power thresholds, respectively;

activating first or second limit command signals if said clip detect signal is active and if said respective audio power value is above said respective power threshold;

modifying said first scalar gain command in a first attack mode if said first limit command signal is active, wherein said first attack mode is comprised of progressively reducing said first scalar gain command below said first reference value;

restoring said first scalar gain command in a first decay mode if said first limit command signal is not active, wherein said first decay mode is comprised of progressively increasing said first scalar gain command up to said first reference value;

modifying said second scalar gain command in a second attack mode if said second limit command signal is active, wherein said second attack mode is comprised of progressively reducing said second scalar gain command below said second reference value; and restoring said second scalar gain command in a second decay mode if said second limit command signal is not active, wherein said second decay mode is comprised of progressively increasing said second scalar gain command up to said second reference value.

14. The method of claim 13 wherein said step of measuring first and second audio power values is comprised of:

rectifying said first and second pre-limiter audio signals; and averaging said pre-limiter audio signals according to predetermined sliding windows.

15. The method of claim 13 wherein said step of measuring first and second audio power values is comprised of:

rectifying said first and second pre-limiter audio signals; and peak detecting said pre-limiter audio signals.

16. The method of claim 13 further comprising the steps of:

independently limiting a third audio channel in response to clipping distortion; and activating said first limit command signal in response to active limiting of said third audio channel.

17. The method of claim 13 wherein said first and second power thresholds are substantially equal.

18. The method of claim 13 wherein said first and second references values are substantially equal to one.

19. The method of claim 13 wherein said first and second references values are comprised of first and second audio volume commands, respectively.

20. The method of claim 19 wherein said first and second audio volume commands are substantially equal.

* * * * *